(12) United States Patent
Tsai et al.

(10) Patent No.: US 6,747,336 B2
(45) Date of Patent: Jun. 8, 2004

(54) TWIN CURRENT BIPOLAR DEVICE WITH HI-LO BASE PROFILE

(75) Inventors: Jun-Lin Tsai, Hsin Chu (TW); Ruey-Hsing Liu, Miao-Li (TW); Chiou-Shian Peng, Hsin-Chu (TW); Kuo-Chio Liu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/804,389

(22) Filed: Mar. 13, 2001

(65) Prior Publication Data

US 2001/0010963 A1 Aug. 2, 2001

Related U.S. Application Data

(62) Division of application No. 09/245,560, filed on Feb. 5, 1999, now Pat. No. 6,211,028.

(51) Int. Cl.[7] ........................ H01L 27/082; H01L 27/102; H01L 29/70; H01L 31/11
(52) U.S. Cl. ............................. 257/592; 438/350
(58) Field of Search .......................... 257/585, 586, 257/587, 589, 590, 591, 592, 593, 594, 565, 197, 607, 655

(56) References Cited

U.S. PATENT DOCUMENTS

| | | | |
|---|---|---|---|
| 3,648,123 A | * 3/1972 | Ernick et al. | ............. 317/235 |
| 4,347,654 A | 9/1982 | Allen et al. | ............. 29/576 B |
| 4,866,000 A | 9/1989 | Okita | ............. 437/31 |
| 5,130,262 A | 7/1992 | Masquelier et al. | ............. 437/31 |
| 5,140,400 A | * 8/1992 | Morishita | ............. 357/34 |
| 5,213,988 A | 5/1993 | Yamauchi et al. | ............. 437/31 |
| 5,480,816 A | 1/1996 | Uga et al. | ............. 437/31 |
| 5,496,746 A | 3/1996 | Matthews | ............. 437/31 |
| 5,548,158 A | * 8/1996 | Bulucea et al. | ............. 257/592 |
| 5,569,612 A | 10/1996 | Frisina et al. | ............. 437/31 |
| 5,939,769 A | * 8/1999 | Frisina et al. | ............. 257/592 |

FOREIGN PATENT DOCUMENTS

| | | | |
|---|---|---|---|
| JP | 359195866 A | * | 11/1984 |
| JP | 363127567 A | * | 5/1988 |
| JP | 363133670 A | * | 6/1988 |

* cited by examiner

Primary Examiner—Long Pham
Assistant Examiner—Dana Farahani
(74) Attorney, Agent, or Firm—George O. Saile; Stephen B. Ackerman

(57) ABSTRACT

A bipolar transistor is described whose I-V curve is such that it operates in two regions, one having low gain and low power consumption and another having higher gain and better current driving ability. Said transistor has a base region made up of two sub regions, the region closest to the emitter having a resistivity about an order a magnitude lower than the second region (which interfaces with the collector). A key feature of the invention is that the region closest to the collector is very uniformly doped, i.e. there is no gradient or built-in field present. In order to produce such a region, epitaxial growth along with boron doping is used rather than more conventional techniques such as ion implantation and/or diffusion.

9 Claims, 4 Drawing Sheets

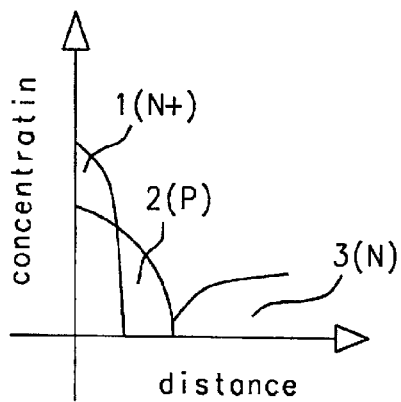
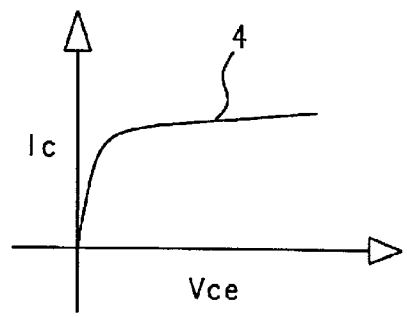
FIG. 1a
Prior Art
FIG. 1b
Prior Art
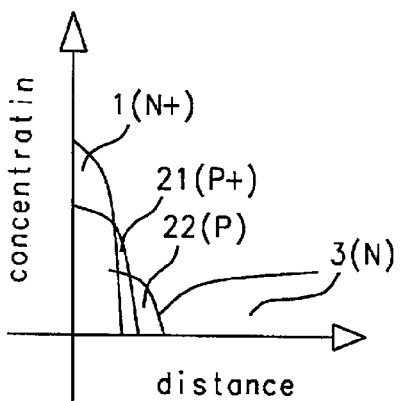
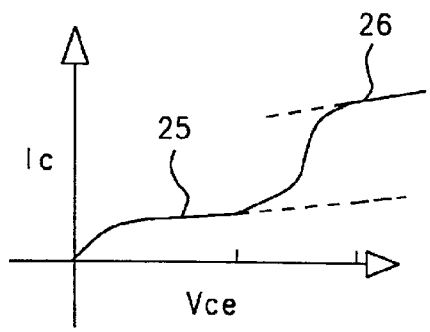
FIG. 2a
FIG. 2b

US 6,747,336 B2

TWIN CURRENT BIPOLAR DEVICE WITH HI-LO BASE PROFILE

This is a division of patent application Ser. No. 09/245,560, filing date Feb. 5, 1999 now U.S. Pat. No. 6,211,028, Twin Current Bipolar Device With Hi-Lo Base Profile, assigned to the same assignee as the present invention.

FIELD OF THE INVENTION

The invention relates to the general field of bipolar transistors with particular reference to the control of base region doping and its effect on the electrical characteristics.

BACKGROUND OF THE INVENTION

As is well known, bipolar transistors, in their most elemental form, comprise a sandwich made up of three layers of semiconducting material, the middle layer being of an opposite conductivity type to the outer layers. Much work has been done on optimizing both the dimensions of the three layers as well as determining the best way to distribute dopants within them. For example, in the graded-base transistor, first developed over 40 years ago, it was found that the frequency response of a transistor could be increased by providing a built-in field across the base region to aid the transport of carriers from emitter to collector. In order to produce such field, a resistivity gradient was introduced into the base material as a natural byproduct of the diffusion process.

In FIG. 1a we show a generalized curve of dopant concentration through the cross-section of a transistor. Region 1 of N+ material represents the emitter, region 2 of P type material constitutes the base, and region 3 of N type material forms the collector. Each region was originally formed by using diffusion and/or ion implantation, generally followed by a drive-in diffusion for the purpose of controlling exactly where the interface occurs. In FIG. 1b we show a typical I–V curve 4 (collector current vs. collector to emitter voltage) for a device of this sort. It is evident that, once the knee of the curve has been passed, the current-voltage relationship is linear.

More recently, it has been found that if the base of the device is subdivided into two layers, with the layer closest to the emitter having lower resistivity, a more complicated relationship between $I_C$ and the $V_{CE}$ results. In FIG. 2a, region 21 of P+ material has been introduced closest to the emitter while region 22 of P type material is the one closest to the collector. This results in the I–V curve seen in FIG. 2b where the curve is seen to be made up of two distinct parts, 25 and 26. Depending on the applied voltage being used, such a device can operate at low gain, with accompanying low power consumption, or it can be operated with higher gain and better current driving capability at higher voltages.

As we will show below, the device and method of the present invention are novel but, nevertheless, there already exists a considerable literature that is relevant to their review and understanding. For example, U.S. Pat. No. 5,213,988 Yamauchi et al.), U.S. Pat. No. 4,866,000 (Okita), U.S. Pat. No. 4,347,654 (Allen et al.), and U.S. Pat. No. 5,130,262 (Masuelier et al.) all describe bipolar transistors having double bases comprised of the P+ and P– regions. In U.S. Pat. No. 5,480,816 Uga et al. show a bipolar transistor having three base layers, each with a different dopant concentration:—a P+ primary base layer and a secondary base layer made up of a P– and a P layer.

In U.S. Pat. No. 5,569,612 Frisina discloses a process for manufacturing a bipolar transistor. An N type region is first formed by epitaxial growth over N+ material following which aluminum ions (boron being counter-indicated) are implanted into the epitaxial layer to form a lightly doped P base. This is followed by the formation of a P+ base within the P base, this time using boron ions.

In U.S. Pat. No. 5,496,746, Matthews shows a bipolar transistor having a base layer comprising a buried P+ layer with an intrinsic base and a P– layer. The method of preparation of this device is quite different from that taught by the present invention.

These prior art devices, while having some similarity to the present invention, differ significantly in their internal dimensions and dopant concentrations and therefore provide different I–V curves, breakdown voltages, etc. from those generated by the present invention. Additionally, the present invention teaches a unique process for the manufacture of the device.

SUMMARY OF THE INVENTION

It has been an object of the present invention to provide a bipolar transistor whose characteristic curve operates in two regions, one having low gain and low power consumption and another having higher gain and better current driving ability.

Another object of the invention has been to provide a process for manufacturing said bipolar transistor.

Still another object of the present invention has been that said device and said process be entirely compatible with conventional integrated circuit devices and processes.

These objects have been achieved by providing a bipolar transistor having a base region made up of two sub regions, the region closest to the emitter having a resistivity about an order a magnitude lower than the second region (which interfaces with the collector). A key feature of the invention is that the region closest to the collector is very uniformly doped, i.e. there is no gradient or built-in field present. In order to produce such a region, epitaxial growth along with boron doping is used rather than more conventional techniques such as ion implantation and/or diffusion.

BRIEF DESCRIPTION OF THE DRAWINGS

FIGS. 1a and 1b are for a conventional bipolar transistor and show the relationship between dopant concentration and distance from the surface for the three main zones and the resulting I–V curve that is obtained.

FIGS. 2a and 2b show similar curves to FIG. 1 for a transistor formed according to the process of the present invention.

DESCRIPTION OF THE PREFERRED EMBODIMENTS

We will disclose the present invention by describing the process used for manufacturing the device. Once this has been done the structure of the device will become clear. The process begins with the provision of an N type silicon wafer. Alternatively, the starting point could be an N well that had been formed within any silicon wafer.

Figure 3:
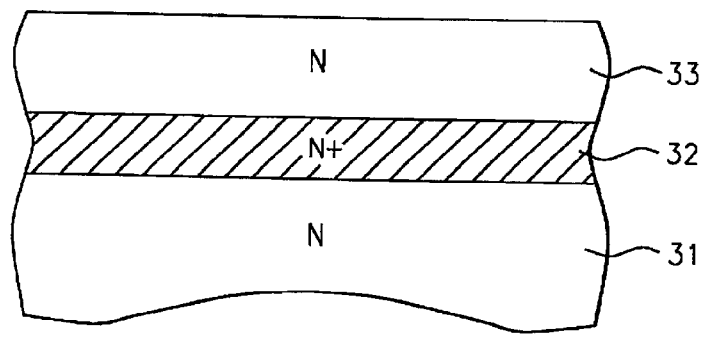
FIGS. 3–6 Illustrate successive steps in the manufacturing process of the present invention.

The first step of the process is the implantation of heavier donor ions such as antimony or arsenic into the P type silicon. For this purpose ion energies of about 80 keV were used but any energy between about 60 and 100 keV would still be satisfactory. The dosage used was between about $1\times10^{15}$ and $5\times10^{15}$ ions/cm$^2$. This was followed by a drive-in diffusion at a temperature between about 1,100 and 1,200° C., with about 1,200° C. being preferred, for about 240 minutes, although any time between about 180 and 300 minutes would still work. This resulted in the formation of an N+ buried layer between about 3 and 4 microns thick. At this stage, the structure has the appearance illustrated in FIG. 3 with N+ buried layer 32 shown between N type layers 31 and 33.

Figure 4:
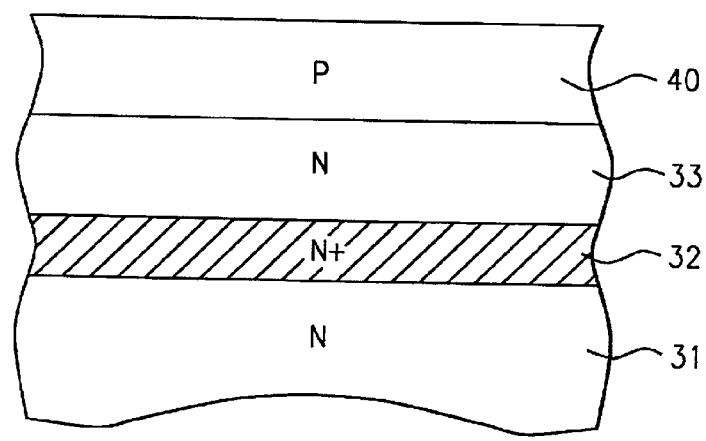

As a special feature and critical step of the process, layer 40 of boron doped silicon is then laid down over layer 33 by means of epitaxial deposition. This is shown in FIG. 4. Our process for epitaxi was atmospheric pressure chemical vapor deposition (APCVD) at a temperature between about 1,100 and 1,200° C. to a thickness between about 2.5 and 5 microns, with 4 microns being preferred, and the boron was introduced by adding boron. During the epitaxial process the N+ buried layer will up diffuse to form the N region shown as layer 33.

The choice of boron, as opposed to aluminum, for doping layer 40 is because of the associated easy control of dosage as well as its full compatibility with current manufacturing processes. Epitaxial growth is needed because it is important that layer 40 be very uniformly doped. Other conventional methods for forming this region, such as ion implantation, diffusion, etc. lead to non-uniform doping and would not provide the device with the desired electrical characteristics. The acceptor concentration in epitaxial layer 40 was between about $4\times10^{15}$ and $5\times10^{15}$ ions/cm$^3$ although any concentration in the range of from about $3\times10^{15}$ to $6\times10^{15}$ ions/cm$^3$ would still be satisfactory. This corresponded to a resistivity between about 30 and 60 ohm cm.

Figure 5:
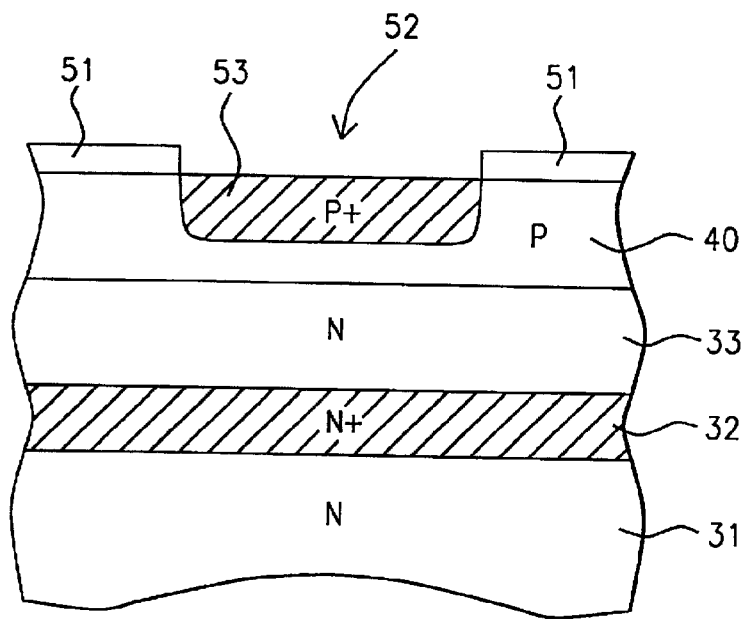

With layer 40 in place, field oxide layer 51 (FIG. 5) is grown on the surface to a thickness of about 8,500 Angstroms and is then patterned by standard photolithographic means to form a mask that covers the surface except at opening 52 so as to define the width of the primary base layer. Typically, opening 52 measures about 15×25 microns$^2$. Boron ions are then implanted into the wafer to form region 53, the primary base layer. The ion energies employed at this stage were between about 30 and 40 keV, with about 35 keV being preferred. The gage used way between about $5\times10^{12}$ and $1\times10^{13}$ ions/cm$^2$. This was followed by a drive-in diffusion at between about 1,000 and 1,100° C. for between about 60 and 120 minutes. This resulted in layer 53 having its lower surface located between about 0.6 and 0.8 microns below the wafer surface.

Following the use of standard photolithography to define the emitter window, it was further patterned to define opening 63 which determined the surface dimensions of the emitter (typically about 5 by 10 microns). Heavy donor ions such as arsenic were now implanted at an ion energy between about 60 and 65 keV, with about 60 keV being preferred. The dosage used was between about $4\times10^{15}$ and $7\times10^{15}$ ions/cm$^2$. This was followed by a drive-in diffusion at between about 950 and 1,000° C. for between about 60 and 100 minutes. This resulted in the formation of emitter layer 64 whose lower surface was between about 0.30 and 0.35 microns below the surface.

Figure 6:
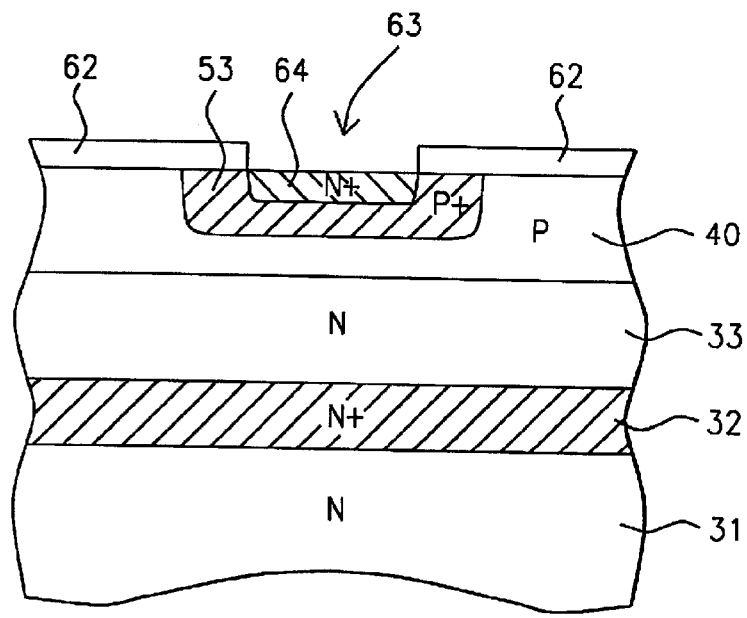

At this point the process of the present invention terminates with all subsequent processing such as contact metalization, etc. being standard. Thus, the structure seen in FIG. 6 also represents the structure of the present invention and is seen to comprise an N+ emitter 64, a primary base layer of P+ material 53, a secondary base layer which is uniformly P type, an N type collector region 33 which is in contact with N+ subcollector 32.

Figure 7:
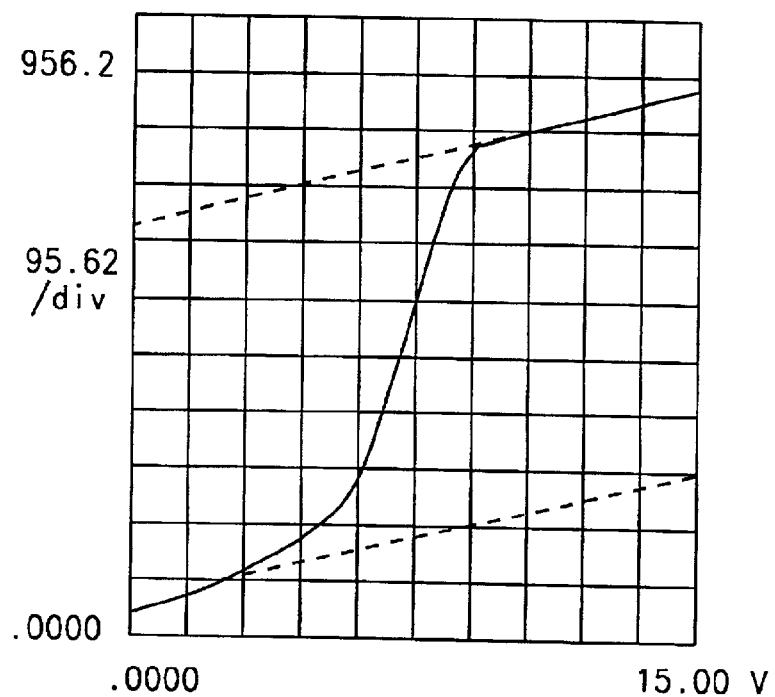
FIG. 7 is an I–V curve for a device manufactured according to the process of the present invention.

The device, formed according to the above process, was found to have the electrical characteristics shown in the I–V curve of FIG. 7. It is important to note that these characteristics are very compatible with the current and voltage levels employed in integrated circuits. Many of the devices described in the prior art are intended for high voltage operation, often as stand-alone devices, and therefore have different structures and electrical characteristics.

Figure 8:
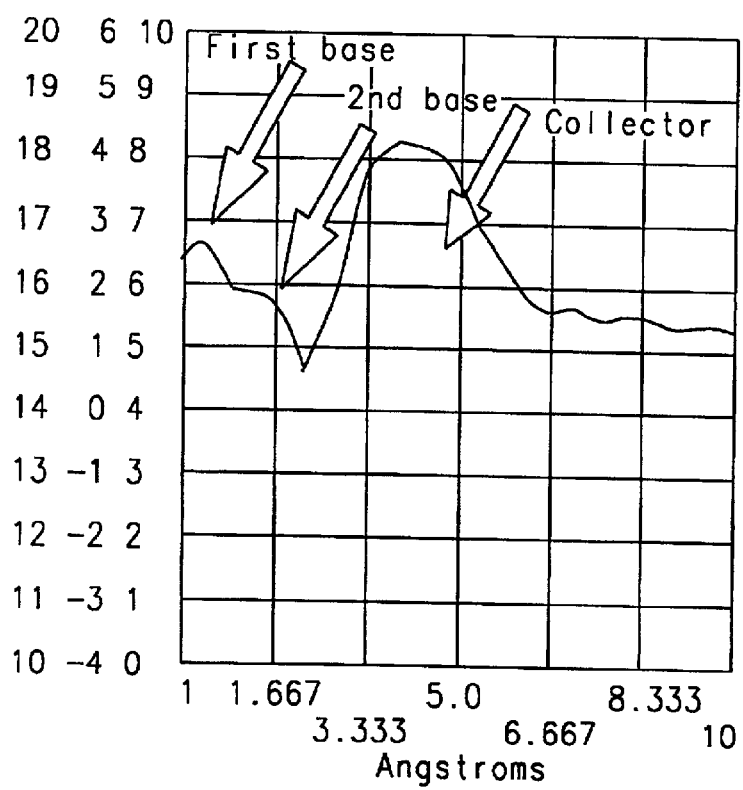
FIG. 8 is a plot of dopant concentration as a function of distance below the surface for a device manufactured according to the process of present invention.

The distribution of dopant along a cross-section of a device formed according to the teachings of the present invention is illustrated in FIG. 8, starting at the interface between the emitter and the primary (or first) base. As can be seen, the doping level in the primary base peaks very quickly at a value of about $3\times10^{16}$ carriers per cc corresponding to a resistivity of about 0.2 ohm cm. The resistivity then drops off fairly rapidly to a value of around 2 ohm cm and is then uniformly maintained over a distance of about 8,000 Angstroms. A rapid falloff followed by a rise in dopant concentration is then seen as the collector region is reached.

While the invention has been particularly shown and described with reference to the preferred embodiments thereof, it will be understood by those skilled in the art that various changes in form and details may be made without departing from the spirit and scope of the invention.

What is claimed is:

1. A twin gain bipolar transistor comprising:
   an N type silicon body having an upper surface;
   an N+ buried collector located a first distance below said upper surface and having a thickness;
   a secondary base region comprising P type silicon, throughout which boron ions are uniformly distributed, and extending a second distance below said upper surface;
   a primary base region of boron doped P+ silicon, wholly within said secondary base region and extending a third distance below said upper surface, said third distance being less than said second distance; and
   an emitter region comprising a region of N+ silicon wholly within the primary base region and extending a fourth distance below said upper surface.

2. The transistor described in claim 1 wherein said first distance is between about 630 and 732 microns.

3. The transistor described in claim 1 wherein the buried collector has a thickness between about 4 and 5 microns.

4. The transistor described in claim 1 wherein the resistivity of the secondary base region is between about 30 and 60 ohm cm.

5. The transistor described in claim 1 wherein said second distance is between about 0.6 and 0.8 microns.

6. The transistor described in claim 1 wherein resistivity of the primary base region is between about 0.2 and 0.3 ohm cm.

7. The transistor described in claim 1 wherein said third distance is between about 0.6 and 0.8 microns.

8. The transistor described in claim 1 wherein said fourth distance is between about 0.3 and 0.35 microns.

9. The transistor described in claim 1 wherein said N type silicon body is an N type silicon wafer or an N well within a silicon wafer.

* * * * *